US009299425B2

(12) United States Patent
Mohammad et al.

(10) Patent No.: US 9,299,425 B2
(45) Date of Patent: Mar. 29, 2016

(54) SYSTEM AND A METHOD FOR DESIGNING A HYBRID MEMORY CELL WITH MEMRISTOR AND COMPLEMENTARY METAL-OXIDE SEMICONDUCTOR

(71) Applicant: Khalifa University of Science, Technology & Research, Abu Dhabi (AE)

(72) Inventors: Baker Shehadah Mohammad, Abu Dhabi (AE); Dirar Al-Homouz, Abu Dhabi (AE)

(73) Assignee: KHALIFA UNIVERSITY OF SCIENCE, TECHNOLOGY & RESEARCH (KUSTAR), Abu Dhabi (AE)

(*) Notice: Subject to any disclaimer, the term of this patent is extended or adjusted under 35 U.S.C. 154(b) by 0 days.

(21) Appl. No.: 14/474,339

(22) Filed: Sep. 2, 2014

(65) Prior Publication Data

US 2014/0369108 A1    Dec. 18, 2014

Related U.S. Application Data

(63) Continuation of application No. 13/691,830, filed on Dec. 2, 2012, now Pat. No. 8,937,829.

(51) Int. Cl.
*G11C 11/00* (2006.01)
*G11C 13/00* (2006.01)
*G06F 17/50* (2006.01)

(52) U.S. Cl.
CPC ........ *G11C 13/0002* (2013.01); *G06F 17/5072* (2013.01); *G11C 13/0007* (2013.01)

(58) Field of Classification Search
CPC .......... G11C 13/0007; G11C 13/0069; G11C 13/0002; G11C 13/004; G11C 13/003
USPC .............................. 365/148, 158, 51, 63, 101
See application file for complete search history.

(56) References Cited

U.S. PATENT DOCUMENTS

| 8,243,498 | B2 | 8/2012 | Abe et al. |
| 8,331,134 | B2 | 12/2012 | Chiu et al. |
| 8,437,172 | B2* | 5/2013 | Fiorentino et al. ............ 365/148 |
| 8,605,479 | B2* | 12/2013 | Dray et al. ..................... 365/72 |
| 2013/0054886 | A1* | 2/2013 | Eshraghian et al. .......... 711/108 |

* cited by examiner

*Primary Examiner* — David Lam
(74) *Attorney, Agent, or Firm* — Renner, Otto, Boisselle & Sklar LLP

(57) ABSTRACT

The embodiments herein relates to a hybrid non-volatile memory cell system and architecture for designing integrated circuits. The system comprises CMOS access transistor connected to a memristor which stores a data based on a resistance. The system has a word line for accessing the hybrid memory and two bit lines carrying data of mutually opposite values for transferring a data from the memory. The two terminals of the transistor are connected respectively to a first terminal of the memristor and to a first bit line. The gate terminals of the transistors are coupled together to form a word line. The access transistors control the two bit lines during a read and write operation. A control logic performs a read and write operation with the hybrid memory cells. The memory architecture prevents a power leakage during data storage and controls a drift in a state during a read process.

10 Claims, 10 Drawing Sheets

SYSTEM AND A METHOD FOR DESIGNING A HYBRID MEMORY CELL WITH MEMRISTOR AND COMPLEMENTARY METAL-OXIDE SEMICONDUCTOR

CROSS-REFERENCE TO RELATED APPLICATION

The present application is a continuation of and claims priority under 35 U.S.C. §120 to commonly assigned U.S. application Ser. No. 13/691,830, filed 2 Dec. 2012, now U.S. Pat. No. 8,937,829, the entirety of which is hereby incorporated herein by reference.

BACKGROUND

1. Technical field

The embodiments herein generally relate to a memory device and particularly relate to Memristors based memory cells in designing integrated circuits (IC). The embodiments herein more particularly relates to a system and method for designing a hybrid memory cell with Memristor as memory element, and Complementary Metal-Oxide Semiconductor (CMOS) control logic for handling all peripheral circuits and input and output of data.

2. Description of the Related Art

The discovery of realizing a memristor as a physical device in 2008 spurred a great interest in using the memristors as a fundamental electronic element. The memristor based technology provides a much better scalability and a higher utilization, when used as a memory. Also, the memristor based technology provides a lower overall energy consumption compared to a traditional CMOS or Flash technology.

The memristor is made of a thin film of a semiconductor oxide. The memristor is an attractive option due to its smaller size starting at 10 nm, relatively low voltage requirements and non-volatile state. Another advantage of the memristor is its compatibility with the current CMOS process technology where the thin film can be realized with a minimum number of extra masks.

The memristors can play an important role in improving a scalability and an efficiency of an existing memory technology. The memristor is a two-terminal circuit element that operates in one of the two nonvolatile resistive states (on or off). These unique characteristics of the memristors give them an important role in shaping a future of the semiconductors as they hold many advantages over the transistors. The Memristors consume much less power than the transistors as they do not require power to retain a state and they are leakage free. In addition to, the small size of a Memristor (<10 nm,) two terminals will improve the scalability of integrated circuits significantly.

The requirements for an embedded memory with a higher density and a lower power are increasing exponentially. This increase is driven by a high demand for a performance and low-power especially for the mobile systems which integrate a wide range of functionality, such as digital cameras, 3-D graphics, MP3 players, email, communication protocols, cryptography, and other applications. However, a technology scaling which enables a packing of 100's of millions of transistors on a same die brings many new design challenges due to an increase in a leakage and variability combined with the requirements for a low voltage supply operation.

The currently available main stream/CMOS-based memory technologies such as Static Random Access Memory (SRAM), Dynamic Random Access Memory (DRAM), Flash, face many challenges in a pursuit to meet an increasing demand for a quick/faster processing and for a larger data size due to the scaling limitations both in terms of an area and a voltage. For instance, SRAM, the most reliable on-chip memory due to a fast access time, is reaching its physical limits in achieving the higher densities and lowering a power consumption. While DRAM which used as a main memory for its high density features also faces challenges due to a voltage scaling requiring an increased cell capacitance. The challenges in the Flash memory are in a cell to cell interface in closely packed cell and a stress-induced leakage current due to a programming with a high voltage across an ultra-thin oxide. In addition to the above, the progress in utilizing the other emerging magnetic-based memory technologies such as embedded Dynamic Random Access Memory (eDRAM), Magneto-Resistive Random Access Memory (MRAM), and Phase Change Random Access Memory (PCRAM), is hindered by a lack of compatibility with the CMOS devices, a slow access time, a temperature sensitivity and a limited scalability. A Phase Change Random Access Memory (PCRAM) has been investigated for long time but a requirement of high voltage to cause a phase change in PCRAM makes the PCRAM less attractive for the low power applications. There have been several attempts to realize a memristor-based memory.

According to one of the prior arts, an approach is provided to design a memristor-based memory as nano-wire crossbar arrays with a memristor at each cross-point (junction). Such a design faces many challenges as it is relatively new and it is not highly compatible with an existing fabrication technology. Also, the crossbar arrays were shown to suffer from the existence of sneak paths in which a stored data at one cross-point (junction) can be easily misread.

According to another prior art, a method to incorporate the memristors in a memory technology is disclosed. The method integrates the memristors within the existing CMOS based memory units. The approach proposed a design for a hybrid memristor-CMOS based Content Addressable Memory (CAM) cell. However, Simulation Program with Integrated Circuit Emphasis (SPICE) simulations for such memory shows that the memristor state is not stable under a continuous reading. Also, a high level architecture for such memory was not designed.

According to another prior art, a SRAM-based memory unit is disclosed. The SRAM uses the traditional six transistors (6T cell SRAM) and is a dominant approach to build an embedded memory. The usage of SRAM adds to the traditional challenges like power, area, yield, timing etc., that are also present for logic gates. The memory unit makes up (occupies) more than sixty percent (60%) of modern processor or SOC and generates the challenges such as retention voltage, minimum voltage, leakage power etc . . . which are specific to a memory unit.

In addition to the 6T SRAM which faces the challenges listed above, the Embedded DRAM (eDRAM) has been proposed as an alternative to 6T SRAM. The eDRAM is found to be less attractive due to a slower access time, a need for refreshes, and an added cost due to additional masks needed to realize the added capacitor . Other Magnetic based memory like MRAM has also been investigated but its adaption has not been successful due to its bigger area and a limited scaling in addition to a slow access time.

Hence, there is a need for a method and a system to design an improved hybrid memory cell with the memristors and CMOS devices. Also, there is a need for a method and a system to design a CMOS logic for controlling a hybrid memory cell. Further, there is a need for a method and a system for integrating a hybrid memory cell with an existing technology and a memory array architecture. Still further, there is a need for a memory cell with a high density and low power consumption properties. Still further, there is a need for providing a specific solution to the problems in a memory cell of a System-on-Chip (SOC) integrated circuit (IC).

The abovementioned shortcomings, disadvantages and problems are addressed herein and which will be understood by reading and studying the following specification.

OBJECTIVES OF THE EMBODIMENTS

The primary object of the embodiments herein is to provide a method and a system for designing an improved hybrid memory cell and a hybrid memory array architecture using a memristor and a CMOS technology.

Another object of the embodiments herein is to provide a method and a system to integrate a memristor to the existing integrated circuits (ICs) technologies for an efficient operation.

Yet another object of the embodiments herein is to provide a hybrid memory cell of memristor and CMOS devices with a high density and a low overall power consumption characteristics.

Yet another object of the embodiments herein is to provide a control logic for a read and write operation for maximizing an efficiency of a memory cell with a low power consumption.

These and other objects and advantages of the embodiments herein will become readily apparent from the following detailed description taken in conjunction with the accompanying drawings.

SUMMARY

The various embodiments herein relates to a hybrid non-volatile memory cell system and a hybrid memory array architecture for designing the integrated circuits (ICs). The system comprises a set of at-least one or more transistors. The set of at-least one or more transistors are Complementary Metal Oxide Semiconductor (CMOS) transistors. A memristor for storing a data based on a resistance value is provided in the system. A word line for accessing the hybrid non-volatile memory system and a set of at-least two bit lines for transferring a data from a hybrid non-volatile memory system are also provided in the system. The memristor is connected to the at-least one or more transistors. A gate terminals of the at-least one or more transistors are coupled together.

According to an embodiment herein, the set of two bit line are a first bit line and a second bit line. A data carried in the first bit line and a data carried in the second bit line are of mutually opposite values.

According to an embodiment herein, the set of at-least one or more transistors are access transistors. The access transistors control the set of two bit lines during a read and write operation. The read operation retrieves a data from the hybrid non-volatile memory cell. The write operation provides a data to the hybrid non-volatile memory cell for storing.

According to an embodiment herein, the hybrid non-volatile memory cell comprises at-least one transistor and at-least one memristor. A first terminal of the transistor is connected to a first terminal of the memristor and a second terminal of the transistor is connected to a first bit line. A gate terminal of the transistor is used as a word line. The word line provides an access to the hybrid non-volatile memory system. A second terminal of the memristor is used as a second bit line.

According to an embodiment herein, the hybrid non-volatile memory cell comprises a first transistor, a second transistor and at-least one memristor. The memristor is connected between the first transistor and the second transistor. A first terminal of the first transistor is connected to a first bit line. A second terminal of the second transistor is connected to a second bit line. A gate terminal of the first transistor and a gate terminal of the second transistor are coupled. The coupled gate terminals are used as a word line. The word line provides an access to the hybrid non-volatile memory cell.

According to an embodiment herein, a data stored in the hybrid non-volatile memory cell is a logic one (1). Also, a data stored in the hybrid non-volatile memory cell is a logic zero (0).

According to an embodiment herein, a plurality of hybrid non-volatile memory cells are designed to provide a hybrid memory architecture. The hybrid memory architecture prevents a leakage of a power during a data storage. The hybrid memory array architecture controls a drifting of a read state during a read access.

The embodiments herein provide a control logic and a control logic circuit system for controlling an access to a hybrid memory cell. The control logic circuit system comprises a read logic for reading a data from a hybrid non-volatile memory cell and a write logic for preventing a write operation of a data, when the write data is the same as a data stored in the hybrid non-volatile memory cell. The read logic is designed to satisfy a stability requirement. The control logic performs a read operation and a write operation with one or more hybrid memory cells.

According to an embodiment herein, the control logic is Complementary Metal Oxide Semiconductor (CMOS) logic. The control logic controls all the peripheral circuits to the hybrid memory array architecture. The control logic isolates the hybrid memory array architecture from the external circuits.

According to an embodiment herein, the control logic uses the read and write logic to minimize an instability of a data stored in the hybrid non-volatile memory cells. A direction of a read current is selected to incur minimum impact on a state drift.

The various embodiments herein provide a method of designing an efficient hybrid non-volatile memory cell and a hybrid memory array architecture. The method comprises connecting a one or more transistors to a memristor. The memristor is a memory element. A word line is provided. The word line is a gate terminal of the one or more transistors. A set of two bit lines is also provided. A control logic circuit is created. The control logic regulates or controls an operation related with an accessing of the hybrid non-volatile memory cells. A plurality of hybrid non-volatile memory cells is connected to form a hybrid memory array architecture. The hybrid memory array architecture is accessed for read and writes operation.

According to an embodiment herein, the hybrid non-volatile memory cell comprises at-least one transistor and at-least one memristor. A first terminal of the transistor is connected to a first terminal of the memristor and a second terminal of the transistor is connected to a first bit line. A gate terminal of the transistor is used as a word line. The word line provides an access to the hybrid non-volatile memory system. A second terminal of the memristor used as a second bit line.

According to an embodiment herein, the hybrid non-volatile memory cell comprises a first transistor, a second transistor and at-least one memristor. The memristor is connected between the first transistor and the second transistors. A first terminal of the first transistor is connected to a first bit line. A second terminal of the second transistor is connected to a second bit line. A gate terminal of the first transistor and a gate terminal of the second transistor are coupled. The coupled gate terminals are used as a word line. The word line provides an access to the hybrid non-volatile memory cell.

According to an embodiment herein, the control logic performs a read operation and a write operation with the hybrid non-volatile memory cells in the hybrid memory array architecture.

According to an embodiment herein, the control logic minimizes a state drift during a read operation from the hybrid non-volatile memory cell. The state drift is minimized by reading the data with a decaying voltage. A direction of read is from OFF state to ON state.

According to an embodiment herein, the control logic uses a single ended scheme for a reading operation. The single ended scheme senses a small difference with respect to a reference voltage to recognize a stored data in the hybrid non-volatile memory cell.

According to an embodiment herein, a write operation to the hybrid memory array architecture is executed by turning ON a hybrid memory cell upon selecting a respective word line. A current is passed depending on the data to be stored in the hybrid non-volatile memory cell. A direction of current determines a memristor resistance and in turn a value stored in the hybrid non-volatile memory cell.

According to an embodiment herein, a read operation from the hybrid memory architecture is executed by setting the word line of a preferred hybrid non-volatile memory cell to logic one (1). A second bit line is pre-charged to logic one (1) and a first bit line is driven to logic zero (0). The second bit line is discharged through the memristor.

The data is read by comparing a voltage at the second bit line to a similar circuit with a known value of the memristor using a sense amplifier.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The other objects, features and advantages will occur to those skilled in the art from the following description of the preferred embodiment and the accompanying drawings in which.

Figure 1:
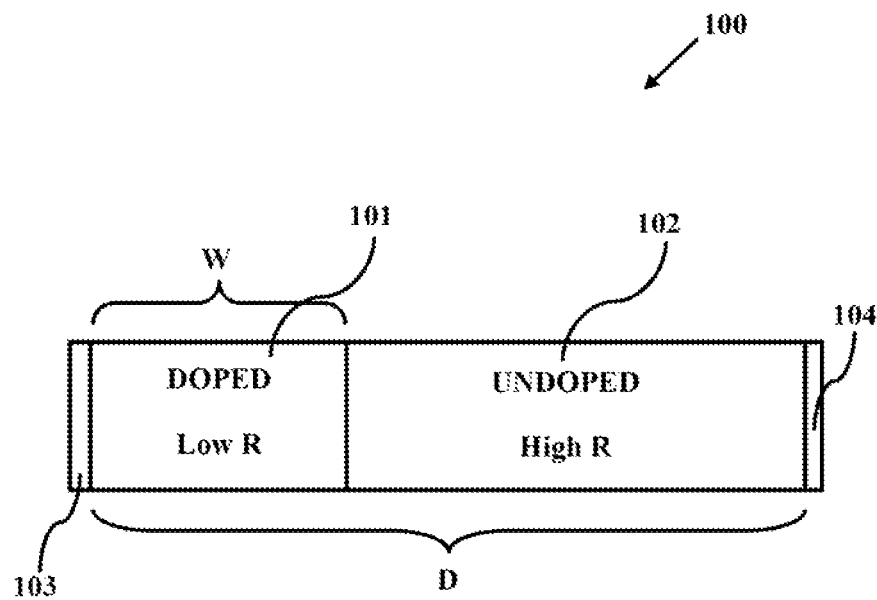
FIG. 1 illustrates a cross sectional view of a typical Memristor, according to a Prior-art.

Although the specific features of the embodiments herein are shown in some drawings and not in others. This is done for convenience only as each feature may be combined with any or all of the other features in accordance with the embodiments herein.

DETAILED DESCRIPTION OF EMBODIMENTS

In the following detailed description, a reference is made to the accompanying drawings that form a part hereof, and in which the specific embodiments that may be practiced is shown by way of illustration. These embodiments are described in sufficient detail to enable those skilled in the art to practice the embodiments and it is to be understood that the logical, mechanical and other changes may be made without departing from the scope of the embodiments. The following detailed description is therefore not to be taken in a limiting sense.

The various embodiments herein relates to a hybrid non-volatile memory cell system and a hybrid memory array architecture for designing the integrated circuits (ICs). The system comprises a set of at-least one or more transistors. The set of at-least one or more transistors are Complementary Metal Oxide Semiconductor (CMOS) transistors. A memristor for storing a data based on a resistance value is provided in the system. A word line for accessing the hybrid non-volatile memory system and a set of at-least two bit lines for transferring a data from a hybrid non-volatile memory system are also provided in the system. The memristor is connected to the at-least one or more transistors. A gate terminals of the at-least one or more transistors are coupled together.

According to an embodiment herein, the set of two bit line are a first bit line and a second bit line. A data carried in the first bit line and a data carried in the second bit line are separated by the resistance of the memristor device. According to an embodiment herein, the set of at-least one or more transistors are access transistors. The access transistors control the set of two bit lines during a read and write operation. The read operation retrieves a data from the hybrid non-volatile memory cell. The write operation provides a data to the hybrid non-volatile memory cell for storing.

According to an embodiment herein, the hybrid non-volatile memory cell comprises at-least one transistor and at-least one memristor. A first terminal of the transistor is connected to a first terminal of the memristor and a second terminal of the transistor is connected to a first bit line. A gate terminal of the transistor is used as a word line. The word line provides an access to the hybrid non-volatile memory system. A second terminal of the memristor is used as a second bit line.

According to an embodiment herein, the hybrid non-volatile memory cell comprises a first transistor, a second transistor and at-least one memristor. The memristor is connected between the first transistor and the second transistor. A first terminal of the first transistor is connected to a first bit line. A second terminal of the second transistor is connected to a second bit line. A gate terminal of the first transistor and a gate terminal of the second transistor are coupled. The coupled gate terminals are used as a word line. The word line provides an access to the hybrid non-volatile memory cell.

According to an embodiment herein, a data stored in the hybrid non-volatile memory cell is a logic one (1). Also, a data stored in the hybrid non-volatile memory cell is a logic zero (0).

According to an embodiment herein, a plurality of hybrid non-volatile memory cells are designed to provide a hybrid memory architecture. The hybrid memory architecture prevents a leakage of a power during a data storage. The hybrid memory array architecture controls a drifting of a read state during a read access.

The embodiments herein provide a control logic and a control logic circuit system for controlling an access to a hybrid memory cell. The control logic circuit system comprises a read logic for reading a data from a hybrid non-volatile memory cell and a write logic for preventing a write operation of a data, when the write data is same as a data stored in the hybrid non-volatile memory cell. The read logic is designed to satisfy a stability requirement. The control logic performs a read operation and a write operation with one or more hybrid memory cells.

According to an embodiment herein, the control logic is Complementary Metal Oxide Semiconductor (CMOS) logic. The control logic controls all the peripheral circuits to the hybrid memory array architecture. The control logic isolates the hybrid memory array architecture from the external circuits.

According to an embodiment herein, the control logic uses the read and write logic to minimize an instability of a data stored in the hybrid non-volatile memory cells. A direction of a read current is selected to incur an impact on a state drift.

The various embodiments herein provide a method of designing an efficient hybrid non-volatile memory cell and a hybrid memory array architecture. The method comprises connecting a one or more transistors to a memristor. The memristor is a memory element. A word line is provided. The word line is a gate terminal of the one or more transistors. A set of two bit lines are also provided. A value of a data carried in the set of two bit lines are mutually opposite to each other. A control logic circuit is created. The control logic regulates or controls an operation related with an accessing of the hybrid non-volatile memory cells. A plurality of hybrid non-volatile memory cells is connected to form a hybrid memory array architecture. The hybrid memory array architecture is accessed for a read and write operation.

According to an embodiment herein, the hybrid non-volatile memory cell comprises at-least one transistor and at-least one memristor. A first terminal of the transistor is connected to a first terminal of the memristor and a second terminal of the transistor is connected to a first bit line. A gate terminal of the transistor is used as a word line. The word line provides an access to the hybrid non-volatile memory system. A second terminal of the memristor used as a second bit line.

According to an embodiment herein, the hybrid non-volatile memory cell comprises a first transistor, a second transistor and at-least one memristor. The memristor is connected between the first transistor and the second transistors. A first terminal of the first transistor is connected to a first bit line. A second terminal of the second transistor is connected to a second bit line. A gate terminal of the first transistor and a gate terminal of the second transistor are coupled. The coupled gate terminals are used as a word line. The word line provides an access to the hybrid non-volatile memory cell.

According to an embodiment herein, the control logic performs a read operation and a write operation with the hybrid non-volatile memory cells in the hybrid memory array architecture.

According to an embodiment herein, the control logic minimizes a state drift during a read operation from the hybrid non-volatile memory cell. The state drift is minimized by reading the data with a decaying voltage. A direction of read is from OFF state to ON state.

According to an embodiment herein, the control logic uses a single ended scheme for a reading operation. The single ended scheme senses and develops a small difference with respect to a reference voltage to recognize a stored data in the hybrid non-volatile memory cell.

According to an embodiment herein, a write operation to the hybrid memory array architecture is executed by turning ON a hybrid memory cell upon selecting a respective word line. A current is passed depending on the data to be stored in the hybrid non-volatile memory cell. A direction of current determines a memristor resistance and in turn a value stored in the hybrid non-volatile memory cell.

According to an embodiment herein, a read operation from the hybrid memory architecture is executed by setting the word line of a preferred hybrid non-volatile memory cell to logic one (1). A second bit line is pre-charged to logic one (1) and a first bit line is driven to logic zero (0). The second bit line is discharged through the memristor. The data is read by comparing a voltage at the second bit line to a similar circuit with a known value of the memristor using a sense amplifier.

FIG. 1 illustrates a cross sectional view of a typical Memristor according to a Prior-art. The memristor 100 is a two terminal non-volatile electrical component. The memristor 100 is made up of thin film of Titanium oxide ($TiO_2$). The memristor 100 comprises two regions. A first region 101 is doped with oxygen vacancies and is called as doped region 101. A second region 102 is not doped with any element and is called as undoped region 102. The doped region 101 provides a variable resistance depending on the flow of the current. The width of the doped region 101 is represented by "W". The overall width of the thin film of $TiO_2$ and is represented by "D". The boundary between the doped region 101 and the undoped region 102 changes on the application of current (flow of charges). The total resistance of the memristor is the individual sum of resistance by doped region 101 and the undoped region 102. The side of the memristor comprises two contact plates 103 and 104. The contact plates 103 and 104 connect the memristor 100 to an external circuit.

Figure 2:
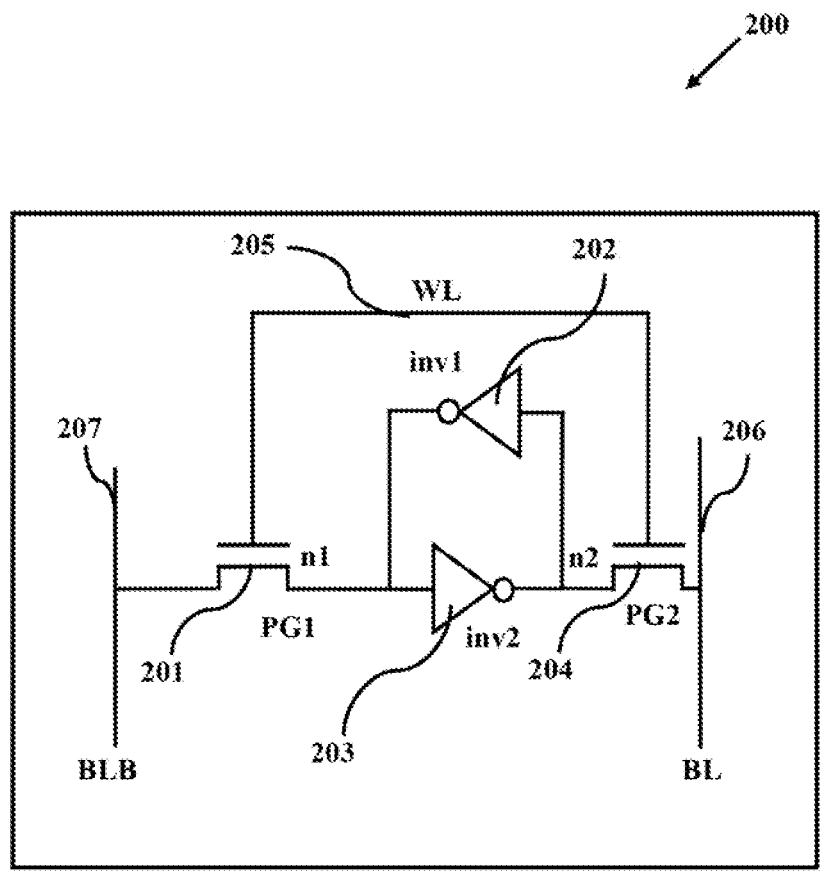
FIG. 2 illustrates a schematic circuit diagram of one memory cell of CMOS 6T SRAM, according to a Prior-art.

FIG. 2 illustrates a circuit diagram of one memory cell of CMOS 6T SRAM according to a Prior-art. The FIG. 2 shows a typical building block of the existing on-chip memory which uses the Complementary Metal Oxide Semiconductor (CMOS) 6T Static Random Access Memory (SRAM) cell 200. The 6T SRAM memory cell 200 comprises six transistors. Out of six transistors, a set of four transistors are placed at the centre and are used as memory elements. The remaining two transistors 201 and 204 are access transistors. The set of four transistors are shown by two inverters 202 and 203. Each of the two invertors 202 and 203 composed of two transistors from the set of four transistors. The access transistors 201 and 204 provide a control over accessing the memory element during a read operation or write operation. The 6T SRAM memory cell 200 further comprises a word line 205 represented by "WL". The word line 205 provides access to the memory cell 200. The word line 205 controls the two access transistors 201 and 204. The access transistors 201 and 204 then control the connectivity of the 6T SRAM memory cell 200 to a Bit line 206 or a Bit line 207. The Bit line 206 is represented by "BL". The Bit Line 207 is represented by "BLB". The Bit line 207 and the Bit line 206 are opposite of each other. One 6T SRAM memory cell 200 stores one bit of data.

Figure 3:
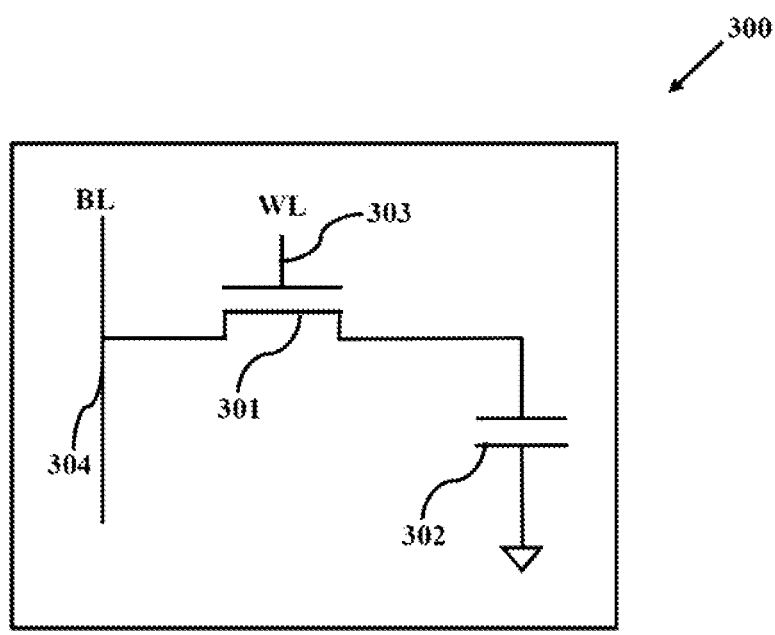
FIG. 3 illustrates a schematic circuit diagram of a memory cell of Dynamic Random Access Memory (DRAM), according to a Prior-art.

FIG. 3 illustrates a schematic circuit diagram of a memory cell of Dynamic Random Access Memory (DRAM) according to a Prior-art. A DRAM memory cell 300 comprises one transistor 301 coupled to a capacitor 302. One end of the transistor 301 is connected to the capacitor 302 and a second end of the transistor is connected to a Bit line "BL" 304. The capacitor 302 is the memory element of the DRAM technology. The two states of the capacitor 302 are logic 0 and logic 1. A charged state corresponds to logic 1 and a discharged state corresponds to logic 0 or vice-versa. The DRAM memory cell 300 further comprises a word line 303 for accessing the memory element. One DRAM memory cell 300 is capable of storing one bit of data. Since one DRAM memory cell 300 comprises very less components (one transistor 301 and one capacitor 302), the density is more in a single chip when compared to SRAM.

Figure 4:
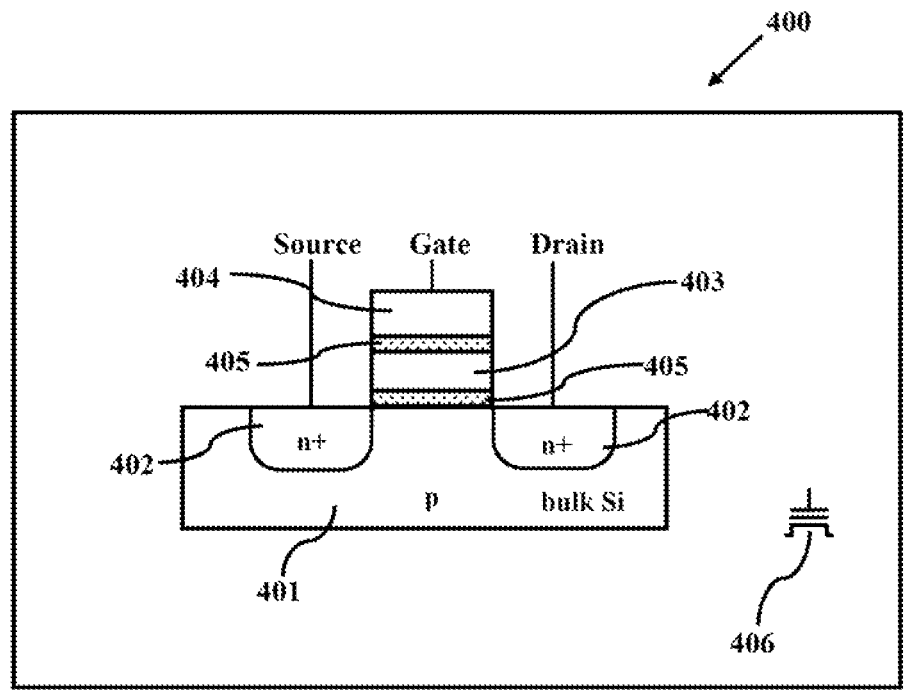
FIG. 4 illustrates a schematic circuit diagram of a memory cell of Flash memory, according to a Prior-art.

FIG. 4 illustrates a schematic circuit diagram of a memory cell of Flash memory according to a Prior-art. A Flash memory cell 400 is similar to a Metal Oxide Semiconductor Field Effect Transistor (MOSFET). The Flash memory cell 400 comprises a silicon substrate 401 doped with P-type elements. The doped silicon substrate 401 is then diffused with n-type elements 402. The Flash memory cell 400 further comprises two gates. A first gate closer to the silicon substrate is referred to as a Floating gate 403. The Floating gate 403 is made up of a poly silicon material. A second gate positioned over the first gate is referred to as a control gate 404. The Floating fate 403 is surrounded by a thin oxide layer of Silicon dioxide ($SiO_2$) 405 for insulation. The Flash memory cell 400 provides three point of contact for interacting with external circuit. The three points of contacts are a source, control gate and a drain. The Flash memory cell 400 is represented by a symbol 406.

Figure 5:
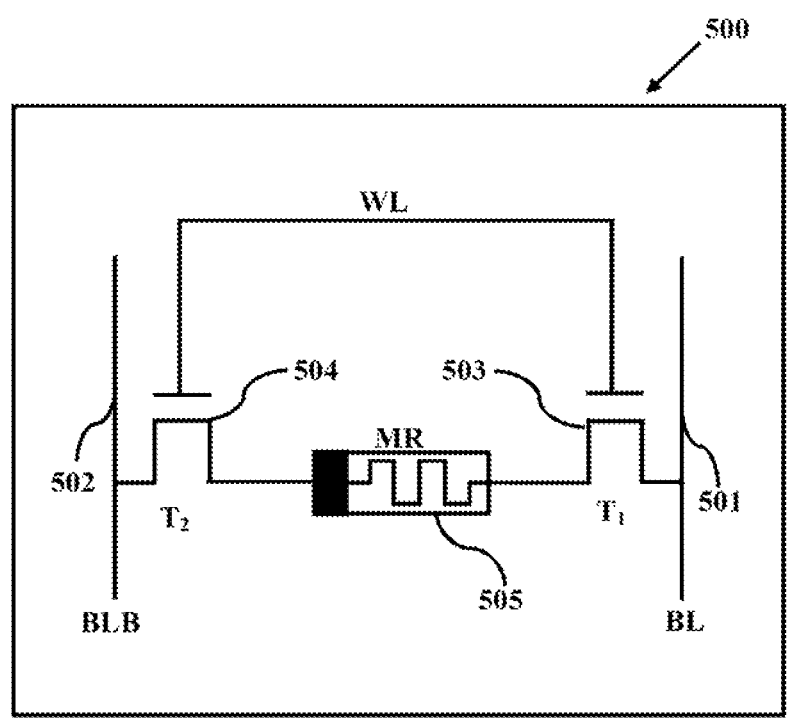
FIG. 5 illustrates a schematic circuit diagram of a hybrid memory cell, according to one embodiment herein.

FIG. 5 illustrates a schematic circuit diagram of a hybrid memory cell, according to one embodiment herein. A hybrid memory cell 500 comprises at-least two bit lines "BL" 501 and "BLB" 502. The bit lines "BL" 501 and "BLB" 502 carry opposite data. If BL 501 carries logic one (1), then BLB carries logic zero (0) and vice-versa. The hybrid memory cell 500 further comprises two transistors (503 and 504) and one memristor 505. The transistor 503 is represented by "$T_1$", transistor 504 is represented by "$T_2$" and memristor is represented by "MR". The memristor 505 serves the purpose of memory element. The two transistors 503 and 504 are access transistors, to provide a control to the memory element memristor 505 during the read and write operations. The memristor 505 stores a data due to the varying resistance during a flow of charge. The resistance of the memristor 505 increases when an electric charge flows in a particular direction and the resistance of the memristor 505 decreases, when the electric charges flow in an opposite direction. When the flow of an electric charge is stopped, the memristor 505 retains the last resistance value. The M2T hybrid memory cell 500 resembles a 6T memory cell where a traditional jam-latch is replaced with one memristor as memory storage element.

With respect to FIG. 5, the hybrid memory cell 500 is similar to the construction of a CMOS 6T SRAM memory cell in which the central four transistors are replaced by the memristor 505 to obtain a hybrid memory cell 500. In other words, when the four memory transistors of the CMOS 6T SRAM are replaced by a single memristor 505, a hybrid memory cell 500 is formed. The hybrid memory cell 500, so formed is termed as M2T memory cell, since the hybrid memory cell 500 comprises one memristor 505 and two access transistors $T_1$ and $T_2$.

Figure 6:
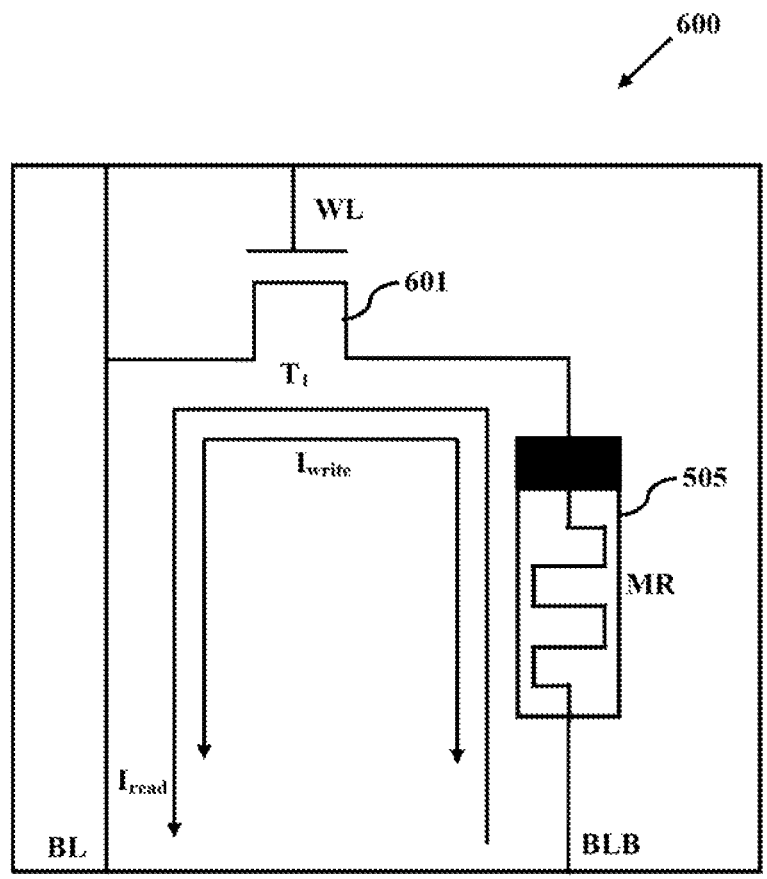
FIG. 6 illustrates a M1T memory cell showing the direction of read and write current, according to one embodiment herein.

FIG. 6 illustrates a M1T memory cell indicating the direction of the read and write current, according to one embodiment herein. The M1T hybrid memory cell 600 is also referred to as MT cell. The letter "M" represents one Memristor 505 and the letter "T" or "1T" represents one Transistor 601. One terminal of the transistor 601 is connected to the memristor 505. The transistor 601 is represented by "$T_1$" and the memristor 505 is represented by "MR". A second terminal of the transistor 601 is used as bit line "BL". A second end of the memristor 505 is used as bit line "BLB". The bit line "BLB" is opposite to the bit line "BL". A gate terminal of the transistor 601 is used as word line and represented by "WL". The FIG. 6 shows current direction in the M1T memory cell 600 during a read and a write operation. A write operation for data logic 1 is performed by passing a current from the bit line BL to BLB through the memristor 505. Similarly, for writing a data logic 0, the current flow through the memristor 505 is reversed. The process for writing logic 0 and logic 1 depends on the direction of current flow. A bi-directional arrow represents the write operation. A single directional arrow represents a read operation. The current flow from the bit line BLB to the bit line the BL during a read operation.

Figure 7:
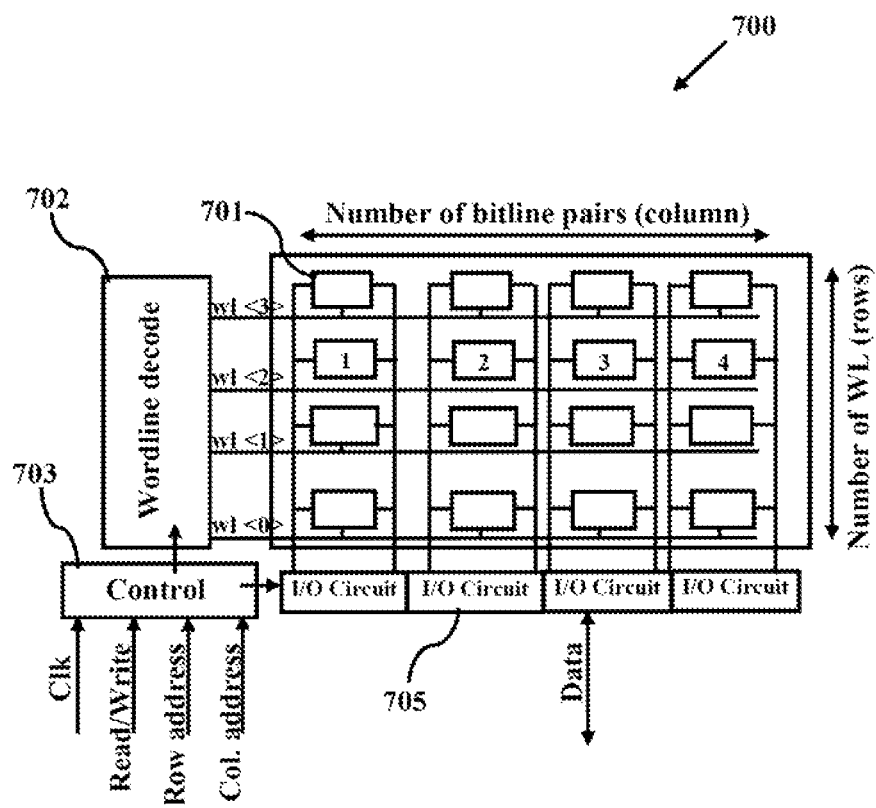
FIG. 7 illustrates a schematic circuit diagram of a typical memory array structure, according to a Prior-art.

FIG. 7 illustrates a schematic circuit diagram of a typical memory array structure according to a Prior-art. The memory array structure comprises a series of existing memory cells 701 arranged in rows and columns. There are four columns and four rows and hence there are sixteen memory cells 701 in total. Each column of memory cells is attached to a pair of bit lines BL and BLB. Each row of the memory cells is connected by a separate word line. A word line decoder 702 is used for the selection of a particular word line for storing the data. A control circuit 703 controls the input to the word lines. The control circuit 703 takes a clock input and a read/write condition status. The control circuit 703 also takes a row and column address input for storing a data. Each column of memory cell is connected to an I/O circuit 705. A total of four I/O circuits 705 are provided. The data from the memory cells are accessed from the four I/O circuits 705. The I/O circuits 705 provide a two way communication. The control circuit 703 controls and manages the I/O circuit 705 and the word line decoder 702 together.

Figure 8:
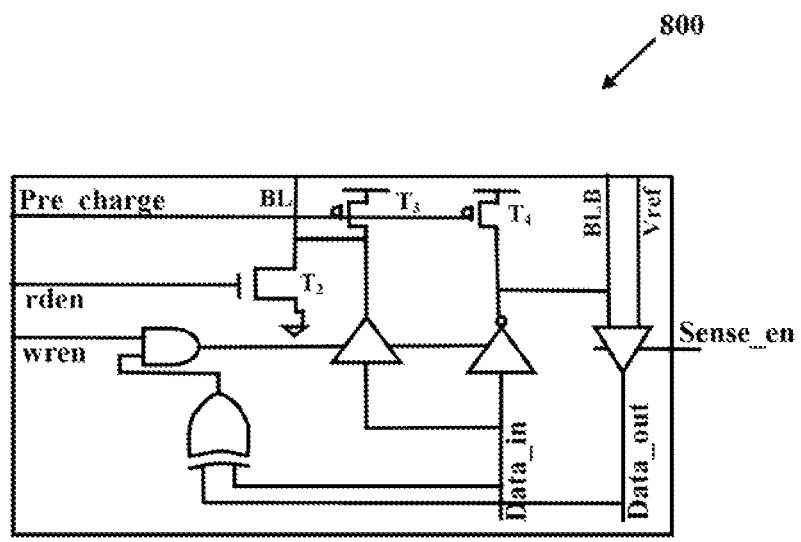
FIG. 8 illustrates a schematic circuit diagram for a control logic used for the hybrid memory cell, according to one embodiment herein.

FIG. 8 illustrates a schematic circuit diagram for a control logic used for the hybrid memory cell, according to one embodiment herein. A CMOS logic circuit 800 is used as a periphery circuit for controlling the memory cells for storing a data. The CMOS control logic circuit 800 mitigates the drifting of the state during a read or multiple write in the hybrid memory cell. The control logic circuit 800 comprises three transistors "$T_2$", "$T_3$" and "$T_4$". The gate input of the transistor $T_2$ act as "read enable" and represented by "rden". One terminal of transistor $T_2$ is grounded and the other terminal serves as a bit line input "BL". The other end of the gates of the transistors $T_3$ and $T_4$ is connected to a "pre charge" input. An input for "write enable" represented with "wren" is provided by a two terminal "AND" gate. One terminal of the AND gate is for "wren" and a second terminal receives input from an output terminal of a XOR gate. The XOR gate is a two input terminal logic gate, and receives an input from Data_in and Data_out terminals. The Data_in terminal enables to input a data into the memory cells. The Data_in terminal is connected to transistors $T_3$ and $T_4$ through the two logic gates. Similarly, the Data out provides an output data from the memory cells during a data retrieving process. The Data_out is the output terminal of a three input logic gate.

The one input of the logic gate is for bit line "BLB" and the second input is for supplying a reference voltage "Vref". A comparison of "Vref" and "BLB" is provided through a terminal called as "sense_in" of the logic gate. The BLB voltage to a similar circuit with pre-determined value for MR is compared with a normal voltage using a sense amplifier. The control circuit adopts the input/output logic to prevent a write operation, when the write data is same as the stored data.

According to one embodiment herein, the control logic structure minimizes the state drifts, wherein minimizing the state drifts is a challenging task in a resistive Random Access Memory (RAM). The state drift is minimized by reading a data with a decaying voltage. The direction of read is from OFF to ON which is difficult to change. The control logic circuit 800 structure also utilizes a single ended sense scheme in which only a small difference is needed to be developed to recognize the stored data.

Figure 9:
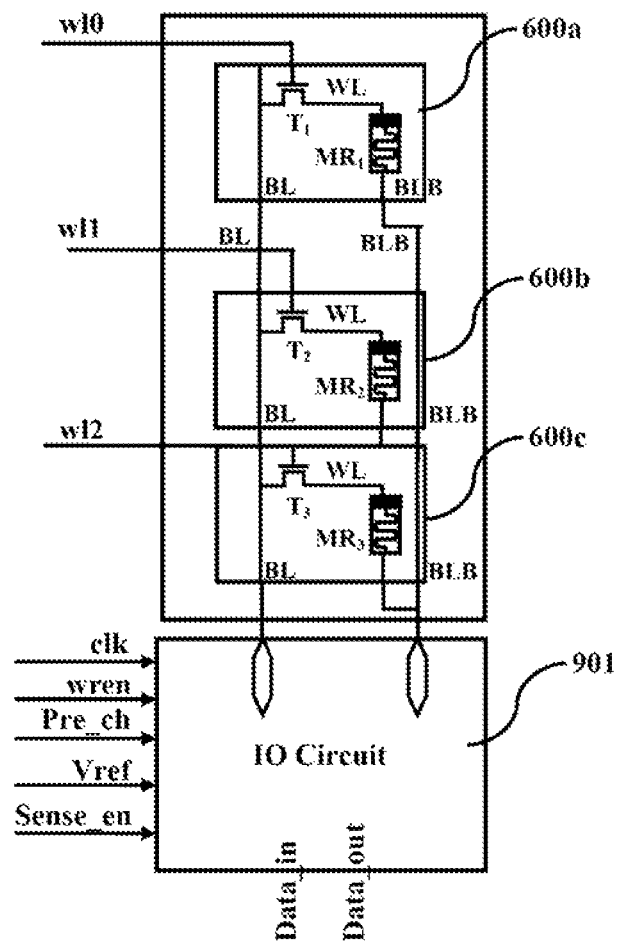
FIG. 9 illustrates schematic circuit diagram of one column M1T memory architecture and control logic, according to one embodiment herein.

FIG. 9 illustrates a schematic circuit diagram of one column M1T memory architecture and a control logic, according to one embodiment herein. The memory architecture comprises three hybrid M1T memory cells 600a, 600b, 600c. Each hybrid memory cell comprises one transistor and one memristor. The memory cell 600a further comprises a transistor $T_1$ and a memristor $MR_1$. Similarly, the memory cell 600b comprises a transistor $T_2$ and a memristor $MR_2$, and the memory cell 600c comprises a transistor $T_3$ and a memristor $MR_3$. In particular, the memory architecture utilizes the memristor as a nonvolatile memory element and normal CMOS for all the periphery logic. The hybrid memory cell 600a, 600b and 600c are referred as "MT" or "M1T" due to the presence of only one transistor and one memristor. The three M1T cells 600a, 600b and 600c are arranged in an array. The gate terminal of the memory cell 600a forms a word line input w10, the gate terminal of the memory cell 600b forms a word line input w11 and the gate terminal of the memory cell 600c forms a word line input w12. Also, the three M1T memory cells 600a, 600b and 600c are provided with a common bit lines BL and BLB. A circuit block below the array of three M1T hybrid memory cells is an I/O circuit 901. The I/O circuit 901 comprises a control logic circuit which handles and manages the inputs from clk, wren, pre-ch, Vref, sense_en, Data_in and Data_out terminals. The clk terminal provides the clock pulse inputs. The wren terminal is a write enable input, which is used for setting the write status during a write operation. The Data_in terminal provides input data to the memory cell for storing. The Data_out terminal assists in retrieving data from the memory cell. With respect to FIG. 9, the memory architecture is provided to utilize the memristor as a nonvolatile element and uses normal CMOS for all the periphery logic.

According to one embodiment herein, a specific waveform signal is used to access the memristor-based memory for read and write operations in the array of hybrid memory cells. A write operation is performed by selecting a word line (WL). Suppose a word line WL0 is selected. The selection of word line WL0 results in transition to logic 1 in T1 on the selected row and the particular hybrid memory cell 600a is turned ON. Then depending on the desired data to write, a current flows in the memristor $MR_1$ terminal. The direction of the current determines the value of the memristor resistance at the end of the write operation. For example, when the data is logic 1, then the current flows from BL to BLB node through the memristor $MR_1$. The flow of the current along that the direction gives a small resistance ($R_{on}$). If data is logic 0 then the current in memristor $MR_1$ flows in the opposite direction and increases the resistance to $R_{off}$. The increase in the resistance from a lower value to a higher value due to a current reversal in memristor $MR_1$ is called switching.

Similarly to the write operation, a read operation is performed to retrieve the data stored in the array of hybrid memory cells. During a read operation, a word line (WL) is logic 1 for the desired memory entry based on the address. The bit line BLB is pre-charged to logic 1 and BL is driven to logic 0. The BLB node discharges through the memristor $MR_1$. The time constant (Resistance multiplied with capacitance) is determined by the resistance value of $MR_1$ ($R_{on}$ or $R_{off}$). The read circuit for such a memory is designed in a way to satisfy the requirement of stability obtained from the mathematical modeling. This circuit design is also studied using the SPICE simulations.

Figure 10:
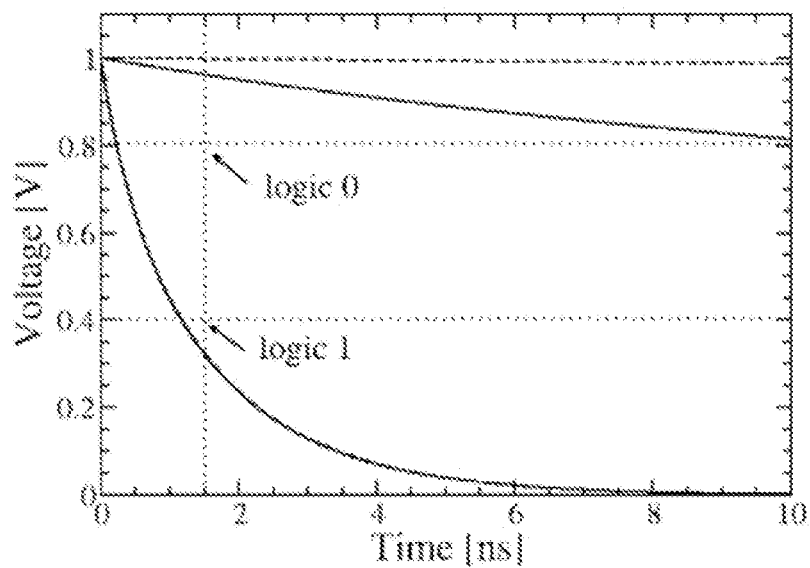
FIG. 10 illustrates a SPICE simulation result of a M1T hybrid memory cell showing logic 1 and logic 0 voltage levels, according to one embodiment herein.

FIG. 10 illustrates a Spice simulation result of a M1T hybrid memory cell showing logic 1 and logic 0 voltage levels, according to one embodiment herein. The graph is plotted between voltage (in volts) and time (in nano seconds). The result shows a tested read operation for the M1T hybrid memory by using a SPICE simulation of simple memristor-capacitor (MR-C) circuit. The circuit uses 20 fF capacitance which is in the same range of a typical bit line "BL" on an advanced CMOS technology node (28 nm). The circuit models the read operation in the hybrid memory cell. The SPICE model used here for the HP memristor is a modified version. The results of this simulation show that there is a sufficient noise margin between the two logic (0 and 1) states (0.8 V–0.4 V=0.4 V).

According to one embodiment herein, the hybrid memory cell comprises fewer components compared to the existing memory cells. Only one memristor is needed to make a memory element compared to several transistors (four in CMOS 6T SRAM cell). Thus, there is an increase in saving in each cell area compared to the 6T SRAM. Such architecture provides a possibility for all the memory cell densities of a Dynamic Random Access Memory (DRAM) and the speed of Static Random Access Memory (SRAM). Also, there is no energy loss due to the leakage of charges in the hybrid memory cell. The hybrid memory cell array structure is similar but advanced to the traditional memory array which uses the CMOS logic for all the periphery circuits and memristor as a storage device. The embodiments herein also provide a hybrid memory cell coupled with the novel read/write logic. The logic enables a robust and reliable design of a memory system using the Memristor as a state element and CMOS logic for control and isolation.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

Although the embodiments herein are described with various specific embodiments, it will be obvious for a person skilled in the art to practice the invention with modifications. However, all such modifications are deemed to be within the scope of the claims.

It is also to be understood that the following claims are intended to cover all of the generic and specific features of the embodiments described herein and all the statements of the scope of the embodiments which as a matter of language might be said to fall there between.

What is claimed is:

1. A hybrid non-volatile memory cell system, the system including a plurality of hybrid non-volatile memory cells, each cell comprising:
   one or more transistors, wherein the one or more transistors are Complementary Metal Oxide Semiconductor (CMOS);
   a memristor for storing a data based on a resistance value;
   a word line for accessing the hybrid non-volatile memory cell; and
   a set of at-least two bit lines for transferring the data from the hybrid non-volatile memory cell;
   wherein the memristor is connected to the at-least one or more transistors, and wherein gate terminals of the at-least one or more transistors are coupled together,
   wherein the at-least one or more transistors comprises a first transistor and a second transistor, wherein a first terminal of the memristor is connected to a second terminal of the first transistor and a second terminal of the memristor is connected to a first terminal of the second transistor, wherein the set of at-least two bit lines includes a first bit line and a second bit line, wherein a first terminal of the first transistor is connected to the first bit line, and wherein a second terminal of the second transistor is connected to the second bit line, and wherein a gate terminal of the first transistor and a gate terminal of the second transistor are coupled, wherein the coupled gate terminals of the first transistor and the second transistor are used as a word line, wherein the word line provides an access to the hybrid non-volatile memory cell.

2. The system according to claim 1, wherein a data carried in the first bit line and a data carried in the second bit line are separated by the memristor, wherein the data gets written to or read from using said set of two bit lines.

3. The system according to claim 1, wherein the one or more transistors are access transistors, wherein the access transistors control the set of two bit lines during a read and write operation, wherein the read operation retrieves a data from the hybrid non-volatile memory cell, and wherein the write operation provides a data to the hybrid non-volatile memory cell for storing.

4. The system according to claim 1, wherein the data stored in the hybrid non-volatile memory cell is one of a logic one (1) and a logic zero (0).

5. The system according to claim 1, wherein a plurality of hybrid non-volatile memory cells are designed to provide a hybrid memory architecture, wherein the hybrid memory architecture prevents a leakage of a power during a data storage, and wherein the hybrid memory array architecture controls a drifting of a read state during a read access.

6. A hybrid non-volatile memory cell system including a plurality of hybrid non-volatile memory cells, each cell comprising:
   a Complementary Metal Oxide Semiconductor (CMOS) transistor;
   a memristor for storing a data based on a resistance value;
   a word line for accessing the hybrid non-volatile memory cell; and
   a set of at-least two bit lines, a first bit line and a second bit line, for transferring the data from the hybrid non-volatile memory cell;
   wherein a first terminal of the transistor is connected to a first terminal of the memristor and the first terminal of the memristor is not connected to any transistor other than the transistor, wherein a second terminal of the transistor is connected to the first bit line, wherein a gate terminal of the transistor is used as a word line, wherein the word line provides an access to the hybrid non-volatile memory cell, and wherein a second terminal of the memristor is connected to the second bit line.

7. The system according to claim 6, wherein a data carried in the first bit line and a data carried in the second bit line are separated by the memristor, wherein the data gets written to or read from the memristor using the set of at least two bit lines.

8. The system according to claim 6, wherein the transistor controls the at least two bit lines during a read and write operation, wherein the read operation retrieves data from the hybrid non-volatile memory cell, and wherein the write operation provides data to the hybrid non-volatile memory cell for storing.

9. The system according to claim 6, wherein data stored in the hybrid non-volatile memory cell is one of a logic one (1) or a logic zero (0).

10. The system according to claim 8, wherein a plurality of hybrid non-volatile memory cells are designed to provide a hybrid memory architecture, wherein the hybrid memory architecture prevents a leakage of a power during a data storage, and wherein the hybrid memory array architecture controls a drifting of a read state during a read access.

* * * * *